United States Patent [19]

Harper, Jr. et al.

[11] Patent Number: 5,519,663

[45] Date of Patent: May 21, 1996

[54] PRESERVATION SYSTEM FOR VOLATILE MEMORY WITH NONVOLATILE BACKUP MEMORY

[75] Inventors: James D. Harper, Jr., Hazel Green; Larry J. Cole, Huntsville, both of Ala.

[73] Assignee: SCI Systems, Inc., Huntsville, Ala.

[21] Appl. No.: 314,158

[22] Filed: Sep. 28, 1994

[51] Int. Cl.[6] .................................................. G11C 13/00
[52] U.S. Cl. ................................................. 365/229; 365/226
[58] Field of Search .................................... 365/229, 226; 371/66

[56] References Cited

U.S. PATENT DOCUMENTS

| | | |
|---|---|---|
| 4,800,533 | 1/1989 | Arakawa . |
| 4,943,961 | 7/1990 | Sparks . |
| 4,959,774 | 9/1990 | Davis . |
| 5,003,192 | 3/1991 | Beigel . |
| 5,204,840 | 4/1993 | Mazur . |
| 5,390,322 | 2/1995 | O'Brien et al. .................. 365/229 |

OTHER PUBLICATIONS

"nvSram an Alternative to EEPROMS"–*Military & Aerospace Electronics* Mar. 28, 1994, p. 81.

*Primary Examiner*—Terrell W. Fears
*Attorney, Agent, or Firm*—Curtis, Morris & Safford; Gregor N. Neff

[57] ABSTRACT

In a preservation system for a volatile memory associated with a nonvolatile memory, an energy storage portion accumulates energy while power is provided normally. When a power outage occurs, the stored energy is supplied to the volatile memory. Enough backup power is stored to accommodate the vast majority of unintentional interruptions of power. Eventually, after removal of external power, when the backup power decreases to a predetermined amount, data in the volatile memory is transferred to the nonvolatile memory. The preferred use for the preservation system is in an environment with vibration and/or power switching transients that affect the supply of power, such as an aircraft.

22 Claims, 3 Drawing Sheets

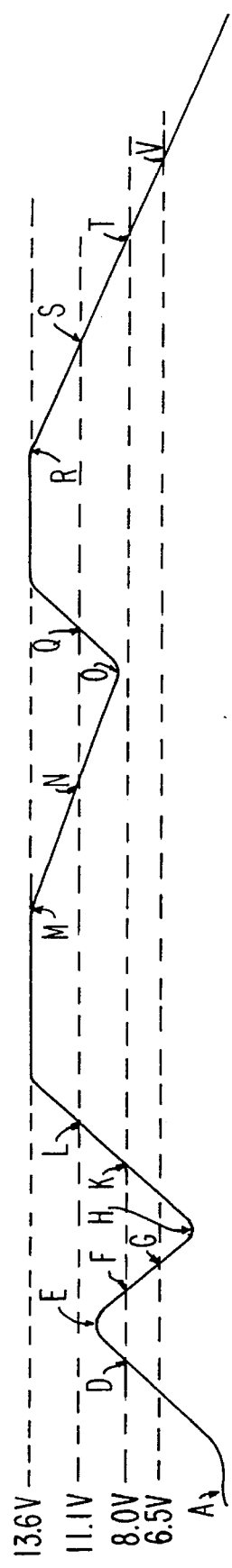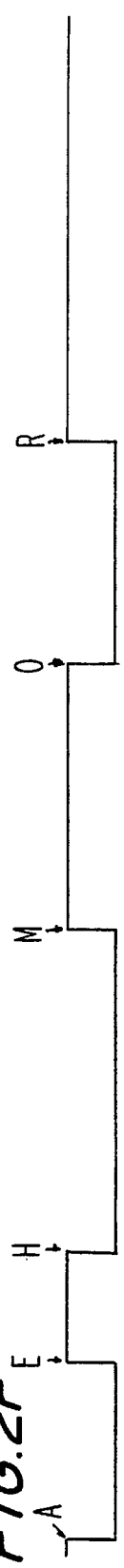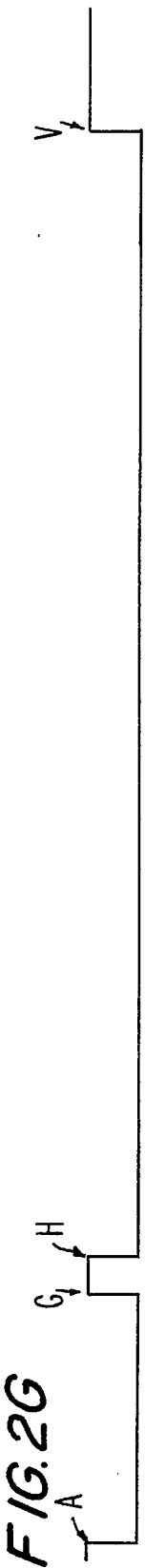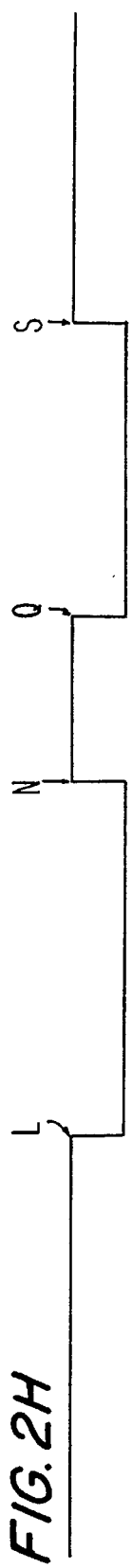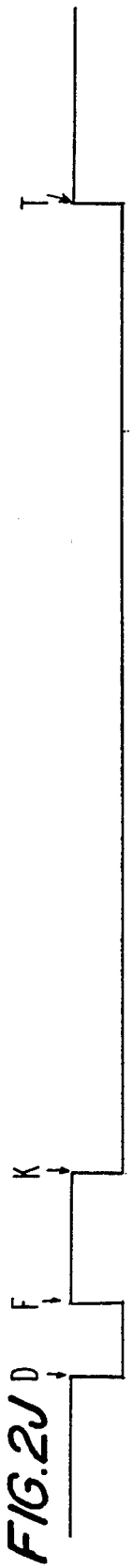

PRESERVATION SYSTEM FOR VOLATILE MEMORY WITH NONVOLATILE BACKUP MEMORY

BACKGROUND OF THE INVENTION

The present invention relates to a power preservation system for volatile memory with nonvolatile backup memory, and, more particularly, is directed to a system for providing temporary power during unintentional outages of externally supplied power.

In military aircraft, electric power is provided for electric utilization equipment, such as a host computer. The aircraft electric power system includes a main power source derived from aircraft generators driven by the aircraft engines, an emergency power source such as batteries, power conversion equipment, an interconnection network and so forth.

When the electric power system transfers between power sources, power outages and transients may occur. In fact, due to vibration, outages and transients occur very frequently. This causes serious problems.

One such problem is that, unless special precautions are taken, data stored in the aircraft computer memory will be lost due to such power outages. Maintaining the reliability of this information is a serious problem because the data is crucial to flight of the aircraft, operation of weapons and so forth.

One conventional technique for preventing loss of data due to power outages in aircraft is to use magnetic core memory as the memory for the computer. Advantages of core memory include insensitivity to power outages, robustness in a harsh environment, operability over a wide temperature range, no wear problem (long life), and a relatively fast access time, such as one microsecond. Disadvantages of core memory include its relatively large physical size, such as 6"×9"×1.4" for 256 kilobytes, its relatively high power usage, such as forty watts when accessed, destructive readout (all core memory used in aircraft is of this type), poor availability of small geometry ferrite cores, and difficulty in providing faster access times as required by more modern aircraft.

Another conventional technique, typically used in spacecraft, is to use a plated wire memory. In this scheme, wires coated with magnetic material are laid in parallel, and perpendicular to the wires are wide, flat conductors functioning as word straps. Disadvantages of plated wire memory include very high cost, very large physical size (substantially larger than core memory) and lack of ready commercial availability.

Volatile random access memory (RAM) with battery backup has been used in some military aircraft. However, the batteries have proven to be unreliable, resulting in unacceptably poor aircraft readiness.

Another prior art technique is to use static RAM as the working memory for the host computer, and to transfer the data from static RAM to electronically erasable programmable ROM chips (EEPROMs) when a power outage occurs, and then transfer data back to the static RAM after the outage ends. This technique has at least two problems.

First, while a data transfer is occurring, the working memory is not available to the host computer. Since transfers may occur at critical points in the aircraft flight mission and since the transfers may take a substantial length of time, such unavailability is unacceptable.

Second, an EEPROM has a limited number of storage cycles; that is, an EEPROM wears out after a given number of storage cycles. Because of the frequency of power outages in aircraft, the limit easily can be exceeded over the lifetime of an aircraft. Furthermore, there is no convenient way of checking how many storage cycles a particular EEPROM has actually experienced. Consequently, it is necessary to replace the EEPROMs frequently to ensure that they will be operable when needed. This creates a delicate maintenance requirement that is difficult to perform properly under expected usage conditions of the aircraft.

OBJECTS AND SUMMARY OF THE INVENTION

An object of the present invention is to provide a memory system which avoids the aforementioned disadvantages of the prior art.

Another object of the present invention is to provide such a system which minimizes wear on auxiliary computer memories used in the system.

Yet another object of the present invention is to provide such a system which maintains the availability of computer memories during the majority of unintentional power outages in an aircraft.

A further object of the present invention is to provide such a memory system which has a relatively long life and is relatively fast and compact while being rugged and dependable.

The foregoing objects are met by the provision of a vehicular computer memory protection system in which electrical energy is stored during normal operation. When a power outage occurs, the stored energy is supplied to the volatile memory for a limited time. The time is longer than the duration of the vast majority of power outages. Data in the volatile memory is transferred to the nonvolatile memory only in a relatively small number of outages having exceptionally long durations.

Since backup power is provided during the vast majority of power outages, the volatile memory remains available to the host computer during most of the power outages. That is, the access time delay problem in the prior technique is greatly alleviated.

Since the number of transfers to nonvolatile memory is sharply reduced, for example, to 1% of its former value, the number of store cycles provided by conventional nonvolatile memory such as EEPROMs is sufficient for the lifetime of an aircraft. That is, the wear problem experienced by the nonvolatile memory using the prior technique is greatly alleviated, and it is unlikely that the EEPROMs in a given aircraft will need replacement.

The above, and other objects, features and advantages of the present invention will be apparent from the following detailed description of the preferred embodiments of the present invention when read in conjunction with the accompanying drawings in which corresponding parts are identified by the same reference numeral.

BRIEF DESCRIPTION OF THE DRAWINGS

FIGS. 2A–2H and 2J are timing charts to which reference is made in explaining the operation of the apparatus shown in FIG. 1.

GENERAL DESCRIPTION

Figure 1:
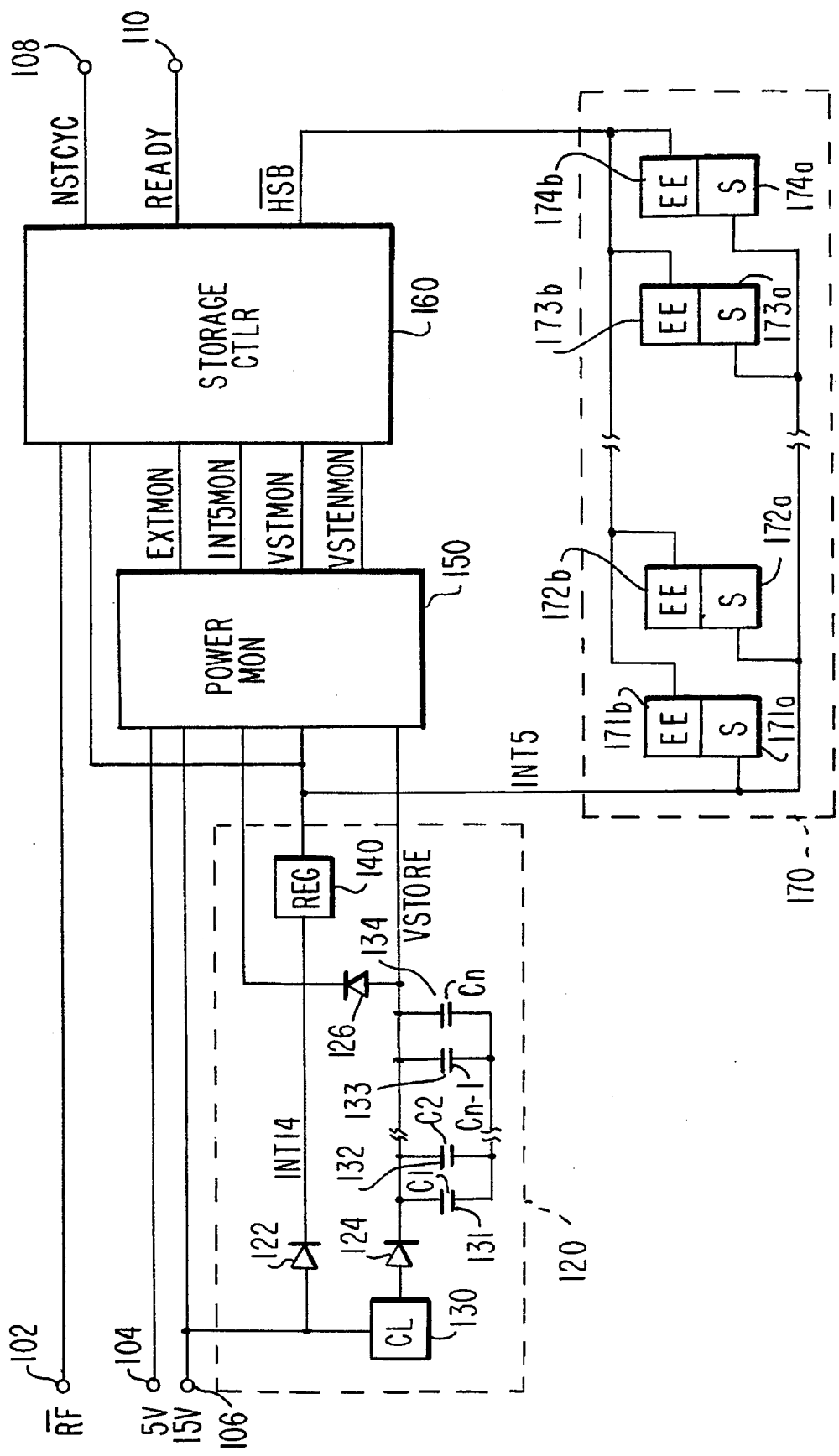
FIG. 1 is a block diagram of an apparatus according to the present invention.

FIG. 1 is a block diagram of a data preservation system for volatile memory used in vehicles, and particularly in aircraft and spacecraft. As used herein and in the claims, the term "aircraft" includes spacecraft and other craft which have power outages due to vibration, electrical switching and power system malfunctions. The system of FIG. 1 preferably takes the form of at least one circuit board for use by a host computer (not shown).

The system shown in FIG. 1 is adapted to monitor an external power supply and to provide temporary internal power to the computer memory when the external power is unsatisfactory, that is, when there is an external power outage.

For example, aircraft specifications established by the Department of Defense, such as MIL-STD-704E, dated May 1, 1991, "Aircraft Electric Power Characteristics" state that the maximum duration of an outage is 50 milliseconds (msec), with a transient permitted at the end of the outage. A large voltage excursion is permitted for short duration transients, such as less than 50 msec, and a smaller voltage excursion is permitted for long duration transients, such as 200 msec.

The duration for which temporary internal power can be supplied is longer than substantially all external power outages expected in aircraft. Consequently, the computer memory remains available for use during the vast majority of the power outages, and usage of the nonvolatile backup memory is sharply reduced.

The system of FIG. 1 includes input terminals 102, 104, 106, a power interface unit 120, a power monitor 150, a storage controller 160, an auxiliary memory bank 170, and output terminals 108, 110.

POWER INTERFACE UNIT

A regulation fault signal ($\overline{RF}$) is applied by the host computer to terminal 102, which conducts the $\overline{RF}$ signal to storage controller 160. The $\overline{RF}$ signal indicates when the external power is bad. The $\overline{RF}$ signal also indicates when the external power is good, but after a predetermined delay. In the present embodiment, the predetermined delay is 2 msec. The importance of the $\overline{RF}$ signal is that when it is asserted, initiation of a new memory cycle (read or write) must be inhibited. The present invention independently determines whether external power is good.

External power at first and second levels is applied to terminals 104 and 106, respectively. In the present embodiment, the first power level is five volts (5 V) and the second power level is fifteen volts (15 V). The first power level is considered to be good when its actual value is 5 V±7.5%, that is, within the range 4.625 V to 5.375 V, and is considered to be bad when it is outside this range. The second power level is considered to be good when its actual value is 15 V±6%, that is, within the range 14.1 V to 15.9 V, and is considered to be bad when it is outside this range.

Terminal 104 supplies power at the first level to power monitor 150. Terminal 106 supplies power at the second level to power interface unit 120 and to power monitor 150.

The first external power level (5 V) is used by buffer circuits (not shown) which function to buffer the address information, input/output data and control information from the host computer. The presence of the externally powered interface circuit permits control over the interface between externally and internally powered logic so that leakage paths which would reduce the power hold-up time can be precluded. That is, the buffer circuits establish a boundary for managing the power interface between the present invention and the host computer.

The second external power level (15 V) is used by the present invention to provide regulated power for an internal power bus and to provide power which is stored as backup power.

The power interface unit 120 is adapted to convert power at the second level to a third level, to provide regulated internal power at a fourth level, to store backup power and to provide the regulated internal power from the backup power during an external power outage. The power interface unit 120 comprises diodes 122, 124, 126, current limiter 130, power storage capacitors 131, 132, 133, 134, and regulator 140.

The second external power level (15 V) is applied to diode 122, which is adapted to output a third power level signal INT14. The second external power level is specified as having a minimum value of 14.1 volts, so the INT14 signal has a minimum value of 14.1 volts less a drop across diode 122 of 0.45 volts, that is, 13.65 volts when being driven by external power. When there is an external power outage, diode 122 functions to prevent leakage of the backup power generated by power interface unit 120.

The second external power level is also applied to inrush current limiter 130, which functions to control the rate of charging of the power storage capacitors 131–134 so that the external power supply is not adversely affected by a sudden large current demand when the preservation system of FIG. 1 stores backup power. In the present embodiment, current limiter 130 limits current consumption to one ampere. Therefore, approximately 50–60 msec are required to charge the capacitor bank to a level, for example, 11.1 volts, sufficient to guarantee that the data written by the host computer to the computer memory since the last power outage will be preserved during the next power outage.

Diode 124 functions to provide current isolation for the power storage capacitors relative to the external power.

Power storage capacitors 131, 132, 133, 134, also referred to as capacitors C1, C2, ..., Cn–1, Cn, function to store temporary backup power VSTORE and to supply this backup power VSTORE when there is an external power outage. The number n and the capacitance of the capacitors is chosen to provide a desired duration of temporary backup power plus enough power for data transfer from the computer RAM to backup memory.

For example, when wet tantalum capacitors such as Sprague M39006/25-0232H tantalum capacitors, in accordance with Military Specification MIL-C-39006 Style CLR81, are used, each having a capacitance of 330 microfarads, the minimum desired duration for supplying backup power is 200 msec, the standby current required by the computer memory and internal logic is 70 mamps, and the amount of voltage required during this period is 5 volts (the voltage required to operate the memory bank for 200 msec, and to store and shut down gracefully thereafter), then approximately sixteen capacitors (n=16) may be used. This number is obtained as follows:

$$\begin{aligned} C &= I_{standby} \cdot \Delta t / \Delta v \\ &= (70 \; mamps) \cdot (200 \; msec)/(5 \; volts) \\ &= 2800 \; \text{microfarads} \end{aligned}$$

Derating each 330 microfarad capacitor by its manufacturing tolerance and temperature coefficient gives a worst case of 175 microfarads per capacitor. Therefore, No. capacitors (n) = $C_{total} / C_{per\ capacitor}$
= 2800/175
= 16

The capacitors C1 . . . Cn function to provide a nominal capacitance of (330)(16)=about 5200 microfarads, and a worst case capacitance of 2800 microfarads. Under typical conditions, the preservation system of the present embodiment can supply up to four seconds of backup power, and under worst case conditions, 200 msec of backup power.

As an alternative to the above described capacitors, HYPERCAP capacitors being developed by Technautics Corporation, Cleveland, Ohio, are suitable for use in the present invention. These rechargeable solid state capacitors are constructed of a carbon cathode, a solid state electrolyte and a silver doped anode. These capacitors are expected to be compact and highly reliable over a wide temperature range.

Diode 126 functions to supply temporary power from the power storage or backup capacitors C1 . . . Cn during an external power outage. That is, when the external power for INT14 signal falls below the level of available backup power, the INT14 signal is produced from the backup capacitors. The second external power level is specified as having a minimum value of, for example, 14.1 volts, so the INT14 signal has a minimum value of 14.1 volts less a drop across each of diodes 124 and 126 of 0.45 volts and the saturation voltage of the current limiter, that is, 14.1 V−(2)(0.45 V)−(0.1 V)=13.1 volts when being driven by internal backup power. It will be appreciated that, because the level of the backup power varies with time, the level of the INT14 signal varies with time.

The INT14 signal is supplied to regulator 140, which is adapted to convert the time varying INT14 signal to a regulated internal power signal INT5 at a fourth level, herein five volts (5 V) for use by the memory bank 170 and other logic included in the preservation system, such as power monitor 150 and storage controller 160. The line on which the INT5 signal is delivered forms a captive power bus, that is, it is substantially independent of the externally supplied voltage.

POWER MONITOR

The power monitor 150 is adapted to receive the two external power levels of 5 V and 15 V, the INT14 signal, the VSTORE signal and the regulated internal power INT5, to produce power monitoring signals EXTMON, INTSMON, VSTMON, and VSTENMON, which are discussed further below, and to supply the power monitoring signals to storage controller 160. Each of the power monitoring signals can be generated by checking thresholds with, for example, a comparator circuit. It will be appreciated that the INT14 signal is used to power the logic of power monitor 150, and its level is not monitored.

STORAGE CONTROLLER

The storage controller 160 is adapted to receive the regulation fault $\overline{RF}$ signal, the regulated internal power signal INTS, and the power monitoring signals from power monitor 150, and to produce a READY signal, a hardware store busy HSB signal and a NSTCYC signal. The controller 160 preferably is a simple state machine constructed from an application specific integrated circuit. Alternatively, the controller 160 may be a microprocessor.

The READY signal indicates that the memory bank 170 can be accessed, and when the memory bank cannot be accessed, that is, when a store cycle is occurring. The preservation system is required to be ready when the regulation fault signal from the host computer indicates that external power is good.

The HSB signal forces memories in the memory bank 170 to undergo a store cycle, that is, to load data from static RAM to EEPROM backup memory.

The NSTCYC signal indicates the number of store operations that have occurred. It will be appreciated that storage controller 160 may include a counter which counts the occurrences of the HSB signal and outputs the resulting count as the NSTCYC signal. The NSTCYC signal is used to readily assess the remaining life of the nonvolatile memory.

MEMORY BANK

The memory bank 170 comprises a plurality of static RAMs 171a, 172a, . . . , 174a, respectively associated with backup memories 171b, 172b, . . . , 174b. A commercially available memory chip incorporating both a static RAM and an associated EEPROM is preferred, such as a Simtek STK12C68-M CMOS 8K×8 High Performance AUTOSTORE Nonvolatile Static RAM, or a Xicor X20C16 High Speed AUTOSTORE NOVRAM. For clarity, only the power supply and forced store leads of each memory in the memory bank 170 are shown, although it will be appreciated that each memory has address leads, input/output leads and control leads. The power supply lead of each memory is coupled to the regulated internal power INT5 signal. The forced store lead of each memory is coupled to the HSB signal from storage controller 160.

The STK12C68-M chip made by Simtek of Colorado Springs, Colo. is a fast static RAM having an access time of 35 nanoseconds with a nonvolatile EEPROM element incorporated in each static memory cell, sometimes referred to as "shadow RAM". The static RAM can be read and written an unlimited number of times while independent nonvolatile data resides in EEPROM for up to ten years. The EEPROM is limited to about 100,000 store cycles. A store from static RAM to EEPROM uses charge stored in an external capacitor provided for each static RAM chip (not shown in FIG. 1, although located at the INT5 lead of each static RAM chip). A store can be initiated through software or forced through hardware by the HSB signal. A recall from EEPROM to static RAM automatically occurs when the input voltage rises above four volts, or when initiated by software.

OPERATION

Operation of the preservation system shown in FIG. 1 will now be explained with reference to the timing charts shown in FIGS. 2A–2J.

Three types of power outages are illustrated by the timing charts in FIGS. 2A–2J. Between points E and H, there is an outage when the memory bank is first turned on, and before the preservation system has built up sufficient backup power. Between points M and O, there is a typical outage demonstrating how the preservation system of the present invention eliminates the need for a store operation while maintaining availability of the static RAM for the host computer. After point R, there is a very long outage, such as when the external power is shut off and a store operation occurs.

Figure 2A:

FIG. 2A illustrates the external voltage at a first level (5 V) applied to terminal 104 of FIG. 1.

Figure 2B:
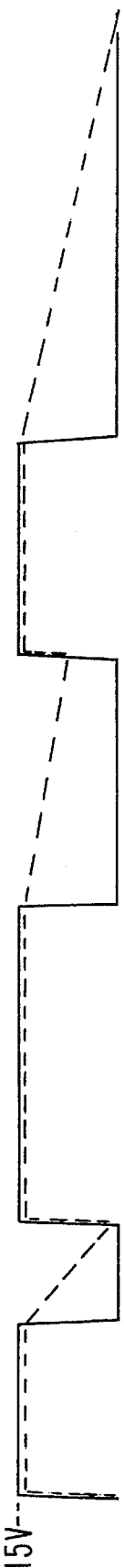

The solid line in FIG. 2B illustrates the external voltage at a second level (15 V) applied to terminal 106 of FIG. 1. The dashed line in FIG. 2B illustrates the INT14 signal developed at the output of diode 122 in FIG. 1.

Although the curves in FIGS. 2A and 2B are shown as varying in synchronism with each other, this need not be the case. The present invention is designed to not accept the initiation of new read/write memory cycles during an outage in either of the external voltages. However, an outage in the external voltage of 15 V causes a need for backup power to be supplied from the capacitors C1 . . . Cn in FIG. 1.

Figure 2C:
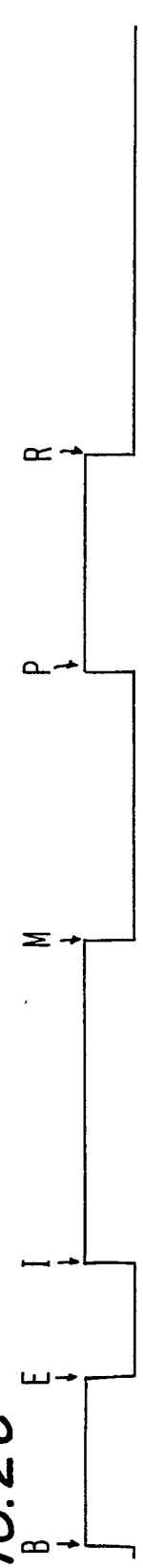

FIG. 2C illustrates the regulation fault $\overline{RF}$ signal applied to terminal 102 in FIG. 1. A high value indicates that the power is good, while a low value indicates that the power is bad. The $\overline{RF}$ signal goes low as soon as the power becomes bad, and remains low for a predetermined delay of 2 msec after the power becomes good. When the power is bad, the preservation system should not accept read or write operations from the host computer to the memory bank 170.

Figure 2D:

FIG. 2D illustrates the hardware store busy (HSB) signal produced by storage controller 160 in FIG. 1, and applied to the memories of the memory bank 170 to cause a store from static RAM to nonvolatile EEPROM backup memory. A high value indicates no store, while a low value forces a store operation. The HSB signal remains low for the duration of a store operation.

FIG. 2E illustrates the VSTORE signal, that is, the level of the backup power available from capacitors C1 . . . Cn of FIG. 1. The level of the VSTORE signal varies with time. In the present embodiment, VSTORE varies from a minimum of zero volts to a maximum of at least 13.6 volts when driven by external power. Three thresholds within the minimum to maximum range of VSTORE are significant. The first threshold, for example, 6.5 V, is the level of VSTORE which is sufficient for supply of the regulated internal power. The second threshold, for example, 8.0 V, is the level of VSTORE representing just enough energy to transfer data from static RAM to backup memory and shut down gracefully. The third threshold, for example, 11.1 V, is the level of VSTORE which is sufficient to guarantee that the data written by the host computer to the memory bank since the last power outage will be preserved during the next power outage.

FIG. 2F illustrates the EXTMON signal, which indicates whether external power is good, or there is an external power outage. The EXTMON signal generally follows the regulation fault $\overline{RF}$ signal, except that the EXTMON signal does not have a time delay after the power becomes good, whereas the $\overline{RF}$ signal does have such a time delay.

FIG. 2G illustrates the INT5MON signal, which indicates whether the VSTORE signal has a level of at least the first threshold, 6.5 V, that is, is sufficient for supply of regulated internal power INT5 by regulator 140.

FIG. 2H illustrates the VSTENMON signal, which indicates when the VSTMON signal should be ignored, that is, considered invalid, and when the VSTMON signal should be considered enabled. When power is applied to the preservation system, the VSTENMON signal is at a high level, but is treated as if it were at a low level. A first high-to-low level transition sets a VSTEN flip-flop (not shown) which remains set until after a forced store operation from volatile memory to nonvolatile memory. When the VSTEN flip-flop is set, the VSTMON signal is enabled, and the VSTENMON signal is not effective. After a store operation, the VSTEN flip-flop is cleared and the VSTENMON signal is non-enabling until after another high-to-low transition.

FIG. 2J illustrates the VSTMON signal, which indicates when a store from static RAM to backup memory should occur. When the preservation system of FIG. 1 is first activated, the VSTMON signal is ignored to reduce the number of stores during times when the host computer is unlikely to have written anything to the memory bank.

At point A, representing a time of 0 msec, both external voltage sources are turned on, as shown in FIGS. 2A and 2B. Consequently, the INT14 signal also turns on, as shown in FIG. 2B. Additionally, the EXTMON signal of FIG. 2F indicates that external power is good, and the INT5MON signal of FIG. 2G indicates that the regulated internal power INT5 signal is good. As shown in FIG. 2E, charge storage on capacitors C1 . . . Cn begins, so the level of VSTORE begins to rise.

When the voltage applied to the memory bank rises above about four volts, the contents of EEPROM are automatically transferred to static RAM. This transfer does not comprise a store cycle. Therefore, even if many outages occur immediately after external power supply commences and before the third threshold is attained by the VSTORE signal, storage cycles of the nonvolatile EEPROM are avoided.

At point B, representing a time of 2 msec, the $\overline{RF}$ signal indicates that the external power is good, and the memory bank 170 should accept read and write operations from the host computer. During the 2 msec interval, the preservation system performs internal housekeeping functions, such as resetting the NSTCYC signal counter, and initializing various latches (not shown).

At point D, the VSTORE signal of FIG. 2E attains the second threshold, and the VSTMON signal goes from indicating a store should occur to indicating that sufficient energy is available to store and shut down gracefully. However, since the VSTENMON signal of FIG. 2H is non-enabling due to lack of a first high to low transition, the VSTMON signal of FIG. 2J is ignored. Meanwhile, the capacitors C1 . . . Cn continue to accumulate charge.

From point B to point E, the host computer may be reading data from and writing data to the memory bank 170.

A first external power outage occurs at point E, approximately 40 msec after external power becomes available. For example, the outage could be a power transient in which the regulation tolerance levels of external power are exceeded. Specifically, the external voltage levels applied to terminals 104 and 106 drop, as shown in FIGS. 2A and 2B, and the $\overline{RF}$ signal and EXTMON signal also change polarity, as shown in FIGS. 2C and 2F. When the $\overline{RF}$ signal is low, the system shown in FIG. 1 is supposed to refuse read and write operations from the host computer.

As an example, in an aircraft environment, when DC power is turned on, 400 Hz ringing power transients may occur. It is desirable to ensure that stores are not initiated by the ringing transients or 50 Hz transient power dropouts. In the present invention, this function is performed by considering the VSTENMON signal of FIG. 2H to be non-enabling until a first high to low level transition occurs.

Also, it is expected that critical mission data will not need to be stored immediately, such as within 60 msec, after power is turned on, so preserving the contents of memory immediately after power turn on is not crucial.

At point E, as shown in FIG. 2E, supply of backup power from capacitors C1 . . . Cn commences, and the VSTORE signal begins to decrease. Correspondingly, the INT14 signal, now representing backup power supplied through diode 126 of FIG. 1, also begins to decrease.

At point F, the VSTORE signal drops below the second threshold, and the VSTMON signal of FIG. 2J indicates that a store should occur. However, since the VSTENMON signal of FIG. 2H is still non-enabling, the VSTMON signal is ignored.

At point G, the VSTORE signal drops below the first threshold, and the INT5MON signal of FIG. 2G goes high, indicating that the regulated internal power INT5 signal is bad. If the INT5 signal is below the first threshold but the voltage applied to the static RAM chips of memory bank 170 is still above, for example, four volts, then the contents of the static RAM will be preserved. It will be recalled that there is a capacitor (not shown) at the voltage supply lead of each static RAM chip. If the voltage applied to the static RAM chips falls below four volts, then the contents of the static RAM will be lost. However, when the voltage rises above four volts, the contents of EEPROM will be automatically transferred to static RAM by the memory chips.

At point H, the external power becomes good, ending the first external power outage, as shown in FIGS. 2A and 2B. The EXTMON signal of FIG. 2F changes polarity to indicate that external power is good. The INT14 signal of FIG. 2B, now representing external power supplied through diode 122 of FIG. 1, rises to its expected level, and the INT5MON signal of FIG. 2G changes polarity to indicate that the regulated internal power INT5 signal is good. Charge begins to accumulate on capacitors C1 . . . Cn, so VSTORE begins to rise, as shown in FIG. 2E.

After the predetermined delay of 2 msec, at point I, the regulation fault $\overline{RF}$ signal indicates that external power is good, as shown in FIG. 2C.

At point K, the VSTORE signal of FIG. 2E reaches the second threshold, so the VSTMON signal of FIG. 2J changes polarity, indicating that a store is not required. No action is taken upon the memory at this point.

At point L, the VSTORE signal of FIG. 2E attains the third threshold, that is, the level of VSTORE which is sufficient to guarantee that the data written by the host computer to the memory bank since the last power outage (point I, in this example) will be preserved during the next power outage. If the first outage had not occurred, the VSTORE signal would have attained the third threshold approximately 50–60 msec after point A.

At point L, the VSTENMON signal of FIG. 2H exhibits a first high to low transition, setting the VSTEN flip-flop which in turn enables the VSTMON signal of FIG. 2J. After the VSTEN flip-flop is set, all transitions of the VSTENMON signal are ignored until a hardware store cycle is performed, at which time the VSTEN flip-flop is cleared.

The VSTORE signal of FIG. 2E continues to increase as charge is accumulated on capacitors C1 . . . Cn, until it reaches its regulated level, which is a minimum of 13.6 V, at about 220 msec. At this point, the preservation system is in its typical state.

A second external power outage occurs at point M, about 300 msec, representing a typical outage for which the preservation system of the present invention is designed. As mentioned, the outage comprises at least one external power level going outside of its specified tolerances, either too high or too low, although FIGS. 2A and 2B show both external power levels going low.

When the second external power outage occurs, the $\overline{RF}$ signal and EXTMON signal change polarity, as shown in FIGS. 2C and 2F. Backup power is supplied from capacitors C1 . . . Cn as the INT14 signal, and the charge on the capacitors begins to decrease so the VSTORE signal begins to decrease and the INT14 signal begins to decrease, as shown in FIGS. 2E and 2B.

Importantly, the INT5MON signal of FIG. 2G continues to indicate that the internal power INT5 signal is good, so that operation of the memory bank 170 can continue without interruption. Although a power outage has occurred, a store cycle is not necessary, which preserves the lifetime of the nonvolatile EEPROM portions of memory bank 170.

At point N, the VSTORE signal of FIG. 2E drops below the third threshold, and the VSTENMON signal of FIG. 2H changes polarity, indicating that the VSTMON signal of FIG. 2J is no longer enabled. However, the VSTEN flip-flop remains enabled, since a store operation has not yet occurred.

At point O, the second external power outage ends, as shown in FIGS. 2A and 2B. The length of the second external power outage is about 190 msec. The EXTMON signal of FIG. 2F changes polarity to indicate that external power is good. The INT14 signal rises, since it is now driven by the external power, as shown in FIG. 2B. Charge begins to accumulate on backup capacitors C1 . . . Cn, so VSTORE begins to rise, as shown in FIG. 2E.

After the predetermined delay of 2 msec, at point P, the regulation fault $\overline{RF}$ signal of FIG. 2C indicates that external power is good.

At point Q, the VSTORE signal of FIG. 2E rises above the third threshold, so the VSTENMON signal of FIG. 2H changes polarity, indicating that the VSTMON signal of FIG. 2J is enabled, which does not affect the state of the VSTEN flip-flop previously set at point L.

Although the second external power outage had a total duration of about 190 msec, the memory bank was available during the entirety of the outage, and a store cycle was not required.

A third external power outage occurs at point R, such as a very long outage which occurs when the external power is shut off. The external power signals in FIGS. 2A and 2B drop, and the $\overline{RF}$ signal and EXTMON signal in FIGS. 2C and 2F change polarity. Backup power supply from capacitors C1 . . . Cn commences, so the VSTORE signal in FIG. 2E and the INT14 signal in FIG. 2B begin to decrease.

At point S, the VSTORE signal drops below the third threshold, so the VSTENMON signal of FIG. 2H goes high, indicating that the VSTMON signal is not enabled. However, the VSTEN flip-flop remains in the enabled state.

At point T, the VSTORE signal drops below the second threshold, so the VSTMON signal of FIG. 2J turns on, and the HSB signal of FIG. 2D changes polarity, forcing a store from static RAM to EEPROM to occur in the memory bank 170. The NSTCYC signal is incremented to indicate that a store cycle has occurred.

At point U, the store cycle is completed, so the HSB signal of FIG. 2D changes polarity. All the data that was in the static RAM portion of memory bank 170 has been safely saved to nonvolatile backup memory, which holds the data for up to, e.g., ten years. The VSTEN flip-flop is cleared.

At point V, the VSTORE signal of FIG. 2E drops below the first threshold, and the INT5MON signal of FIG. 2G changes polarity to indicate that the regulated internal power INT5 signal is bad. Thereafter, charge bleeds from the capacitors C1 . . . Cn until no charge remains.

While the present invention has been described with regard to an aircraft environment, it will be appreciated that it is suitable for any environment wherein data access is critical and wherein power is subject to frequent outages due to, for example, electrical switching.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. An apparatus for providing memory power, comprising:

means for receiving external power;

volatile memory means for storing data while at least a first level of power is provided;

nonvolatile memory means for storing data;

backup power storage means for storing said external power and for providing backup power to said volatile memory means at a level higher than said first level during an outage of said external power; and control means for transferring data from said volatile memory means to said non-volatile memory means in response to the detection of an outage of said external power, and for delaying said transfer until said backup power falls below said first level of power.

2. The apparatus of claim 1, in which said transfer is delayed for a predetermined time sufficient to prevent said transfer of data in a substantial portion of temporary outages of said external power.

3. The apparatus of claim 1, wherein said nonvolatile memory means comprises at least one semiconductor EEPROM.

4. The apparatus of claim 1, wherein said backup power storage means includes a plurality of capacitors connected to be charged from the supply of said external Dower.

5. The apparatus of claim 2, in which said transfer is delayed for a predetermined time sufficient to prevent said transfer in a majority of said temporary outages.

6. The apparatus of claim 1, in which said means for receiving external power is adapted to receive power from an aircraft power supply system.

7. The apparatus of claim 1, in which said volatile and non-volatile memory means are solid-state.

8. An apparatus for providing memory power, comprising:

means for receiving external power;

volatile memory means for storing data while a first level of power is provided;

nonvolatile memory means for storing data while power is not provided;

backup power storage means for storing said external power and for providing the stored external power as backup power to said volatile memory means during an outage of said external power: and control means for controlling transfer of the data stored in said volatile memory means from said volatile memory means to said nonvolatile memory means when said backup power falls below said first level of power and for providing a count of a number of transfers of data from said volatile memory means to said nonvolatile memory means.

9. The apparatus of claim 1, wherein said control means is operative, upon start-up, to prevent said transfer from said volatile memory means to said nonvolatile memory means until said backup power rises to a second level of power.

10. A preservation system for volatile memory means used in an aircraft to store data while a first level of external power is provided, comprising:

nonvolatile memory means for storing data while power is not provided;

backup power storage means for storing said external power and for providing the stored external power as backup power to said volatile memory means during an outage of said external power; and control means for controlling transfer of the data stored in said volatile memory means from said volatile memory means to said nonvolatile memory means when said backup power falls below said first level of power and for providing a count of a number of transfers of data from said volatile memory means to said nonvolatile memory means.

11. An apparatus for providing memory power, said apparatus comprising, in combination, a volatile memory in which data can be stored and from which data can be retrieved by a computer except when data is stored in, or is being transferred to or from a non-volatile memory for data preservation, a non-volatile memory for storing data transferred from said volatile memory, means for conducting power from an external power source to said volatile memory, a backup power supply for supplying power to said volatile memory during power outages of said external source, and a data transfer control device for detecting said power outages and supplying backup power to said volatile memory and preventing data transfer from said volatile memory to said non-volatile memory during each of said power outages for a predetermined length of time, said length of time being sufficient to prevent said data transfer for a substantial portion of temporary outages of said external source, and for causing said data transfer to occur after an outage has persisted longer than said predetermined length of time.

12. Apparatus as in claim 11 in which said backup power supply includes a power storage device for storing power from said external source and delivering its stored power upon detection of one of said outages.

13. Apparatus as in claim 11 in which said apparatus is provided in or for an aircraft computer system.

14. Apparatus as in claim 11 in which said substantial portion is a majority of said temporary outages.

15. An apparatus for providing memory power, said apparatus comprising, in combination, a volatile memory for storing data, a non-volatile memory for storing data transferred from said volatile memory, said non-volatile memory being capable of executing a limited number of read-write cycles before it wears out, means for conducting power from an external power source to said volatile memory, a backup power supply for supplying power to said volatile memory during power outages of said external source, and a data transfer control device for detecting said power outages and supplying backup power to said volatile memory and preventing data transfer from said volatile memory to said non-volatile memory during each of said power outages for a predetermined length of time, said length of time being sufficient to prevent said data transfer for a substantial number of temporary outages of said external source, and for causing said data transfer to occur after an outage has persisted longer than said predetermined length of time, whereby said number of read-write cycles for a given length of operating time for said memory is substantially limited.

16. Apparatus as in claim 15 in which said apparatus is provided in or for an aircraft computer system, and said external power source is an aircraft power supply system.

17. A method of controlling data storage and retrieval in an aircraft computer system having a volatile memory and a power supply, said power supply being subject to relatively frequent temporary power outages, said method comprising the steps of:

(a) determining the duration of the majority of said temporary power outages;

(b) providing backup power from a backup power supply;

(c) providing a non-volatile memory for storing data transferred from said volatile memory to prevent data loss;

(d) detecting the onset of each of said temporary power outages;

(e) supplying back-up power to said volatile memory during each of said outages; and (f) during each outage, transferring data from said volatile memory to said non-volatile memory only after the duration of said outage becomes greater than the duration of a majority of said temporary outages.

18. A method as in claim 17 in which said nonvolatile memory is limited in the total number of read-write cycles it is able to execute.

19. A method as in claim 17 in which said backup power is developed by charging a charge storage device from said power supply and releasing that stored charge upon detection of an outage.

20. A method as in claim 17 in which said computer system is disabled when data is transferred out of said volatile memory memories.

21. A method as in claim 18 including the step of counting said cycles to give information regarding the remaining life of said non-volatile memory.

22. A method of limiting the computer down time and data transfer operations in a computer system having a power supply, a volatile memory for use in the operations of said computer system, and a non-volatile memory for storing data from the memory to protect it from destruction due to temporary power outages, said method comprising the steps of:

(a) detecting the onset of each of said outages and supplying backup power to said volatile memory in response thereto;

(b) maintaining said backup power during each outage for a predetermined time longer than the duration of a majority of said power outages; and (c) transferring data from said volatile memory to said non-volatile memory only if said outage lasts longer than said predetermined time.

* * * * *